United States Patent [19]
Kawabata

[11] Patent Number: 6,072,356
[45] Date of Patent: Jun. 6, 2000

[54] APPARATUS FOR DERIVING A TRIGGER SIGNAL FROM THE AC LINE

[75] Inventor: Frederick Y. Kawabata, Beaverton, Oreg.

[73] Assignee: Tektronix, Inc., Beaverton, Oreg.

[21] Appl. No.: 09/093,584

[22] Filed: Jun. 8, 1998

[51] Int. Cl.[7] ........................................ H01J 19/82
[52] U.S. Cl. ........................ 327/531; 327/52; 324/76.39
[58] Field of Search ............................. 327/531, 51, 52, 327/47; 324/76.19, 76.39, 76.42; 340/854.8

[56] References Cited

U.S. PATENT DOCUMENTS

| | | | |
|---|---|---|---|
| 5,512,819 | 4/1996 | Bourdreaux | 324/66 |
| 5,594,332 | 1/1997 | Harman et al. | 324/127 |
| 5,642,038 | 6/1997 | Kim et al. | 324/76.19 |

FOREIGN PATENT DOCUMENTS 2090986  7/1982  United Kingdom .

*Primary Examiner*—Jung Ho Kim
*Attorney, Agent, or Firm*—Thomas F. Lenihan

[57] ABSTRACT

An apparatus and method for deriving a signal from the AC line and conveying it to processing circuitry employs two wires each of which is non-conductively attached and capacitively coupled to a respective one of a two-wire AC power line. Each of the capacitive pick-offs is coupled to a respective input of a differential amplifier for amplification. Advantageously, because the output signal is a replica of the AC power line signal, the detection threshold can be set at or near zero volts. This makes the detection point insensitive to the amplitude variations of the AC power line. In one embodiment, an output signal is developed at a single ended output of the differential amplifier, and applied to a low pass filter to remove undesired higher frequencies. A further amplifier provides greater amplification of the filtered representation of the AC power line signal, and includes an amplitude limiting circuit to accommodate the wide range of AC line voltages which may be applied to the instrument.

5 Claims, 2 Drawing Sheets

6,072,356

APPARATUS FOR DERIVING A TRIGGER SIGNAL FROM THE AC LINE

FIELD OF THE INVENTION

The subject invention concerns the field of triggering circuits in general, and specifically concerns a circuit for deriving a trigger signal from the AC power line.

BACKGROUND OF THE INVENTION

Many electronic products implement certain functions which are required to be synchronized with the AC line voltage which powers the product. One such product is an oscilloscope, and the function referred to is AC Line Triggering.

It is necessary to derive an AC signal from the AC power line and convey it to a processing circuit in order to implement the desired function. A transformer is often used for this purpose. The transformer is insensitive as to whether the AC voltage is applied to either side or to both sides of the two-wire AC power system. The transformer provides the required safety isolation from the AC line, and produces a signal which is a replica of the AC line voltage. Unfortunately, because the transformer and associated circuitry are coupled to the AC power line, the transformer must be certified by certain regulatory agencies, and any changes in the design will cause the need for a recertification. A transformer also undesirably involves expense in its initial cost and handling.

Another device which is often used to derive a signal from the AC line and convey it to a processing circuit, is an optical isolator. An optical isolator utilizes a current limited LED on the input side, and a phototransistor on the output side. The coupling between the input and out sides of the optical isolator is by means of the light generated by the LED in response to the AC line signal, which illuminates the base portion of the phototransistor, causing it to conduct. The optical isolator shares the same disadvantages as the transformer in terms of the need for proper testing and certification, and in terms of its cost. Additionally, optical isolator circuits exhibit undesirable trigger timing variations in response to amplitude variations in the AC line voltage.

What is needed is an inexpensive way to derive a signal from the AC line, which requires no testing and certification by an agency, and still provides the required safety isolation.

SUMMARY OF THE INVENTION

An apparatus and method for deriving a signal from the AC line and conveying it to processing circuitry employs two wires each of which is non-conductively attached and capacitively coupled to a respective one of a two-wire AC power line. Each of the capacitive pick-offs is coupled to a respective input of a differential amplifier for amplification.

An aspect of the invention is that, because the output signal is a replica of the AC power line signal, the detection threshold can be set at or near zero volts. This makes the detection point insensitive to the amplitude variations of the AC power line.

In one embodiment, an output signal is developed at a single ended output of the differential amplifier, and applied to a low pass filter to remove undesired higher frequencies. A further amplifier provides greater amplification of the filtered representation of the AC power line signal, and includes an amplitude limiting circuit to accommodate the wide range of AC line voltages which may be applied to the instrument.

DETAILED DESCRIPTION OF THE INVENTION

In the following drawing, similarly numbered elements serve similar functions, for example elements 105a, 205a, and 305a, all refer to a similar wire in FIGS. 1, 2, and 3, respectively.

Figure 1:
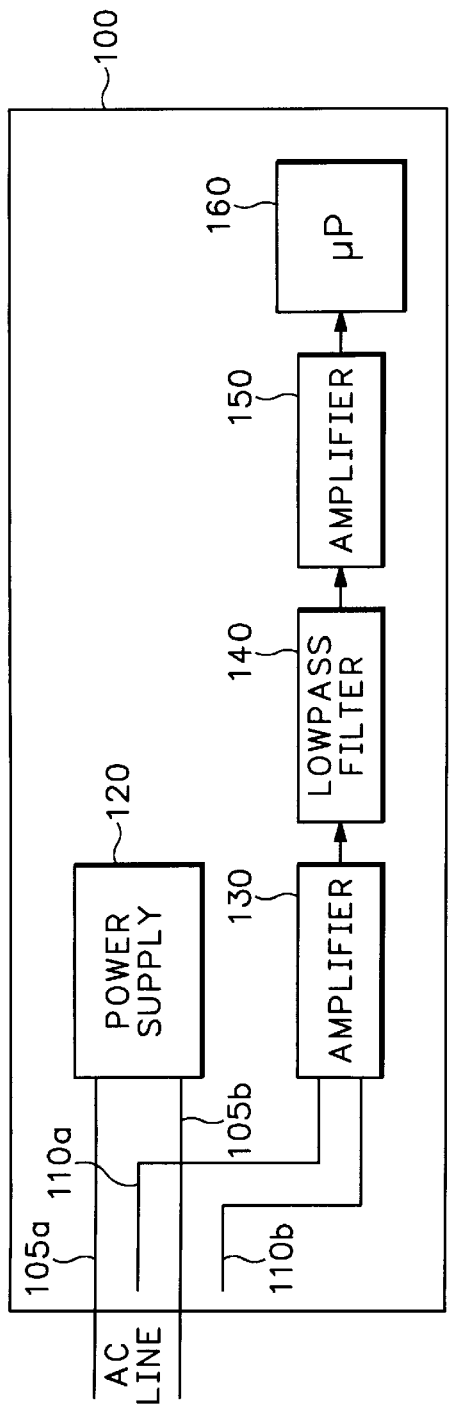
FIG. 1 shows the invention in block diagram form.

Referring to FIG. 1, an instrument 100, which may be an oscilloscope, receives power from the AC line via a pair of wires 105a, 105b, which are coupled to an internal power supply 120. Internal power supply 120 provides operating power to the circuitry of instrument 100. Each of a pair of sense lines comprising wires 110a and 110b is non-conductively fastened, but capacitively-coupled to a respective one of AC power line wires 105a and 105b. Wires 110a and 110b are referred to as AC signal pick-off wires, because they capacitively couple a signal representative of the AC line voltage to a processing channel comprising an amplifier 130, a lowpass filter 140, a further amplifier 150, and ultimately to a control microprocessor ($\mu$P) 160.

Amplifier 130 is a differential amplifier which amplifies the input AC signals equally and provides an output signal at a single-ended output. The amplified AC signal is applied to lowpass filter 140. Lowpass filter 140 may be an RC filter, and is provided to eliminate unwanted high frequency components from the amplified AC signal. Amplifier 150 is a high gain amplifier for providing the majority of the amplification in the AC signal processing channel. Amplifier 150 includes an amplitude limiting circuit to accommodate the wide range of input AC line voltages which may be present, which may be approximately 90 VAC to approximately 250 VAC.

Figure 2:
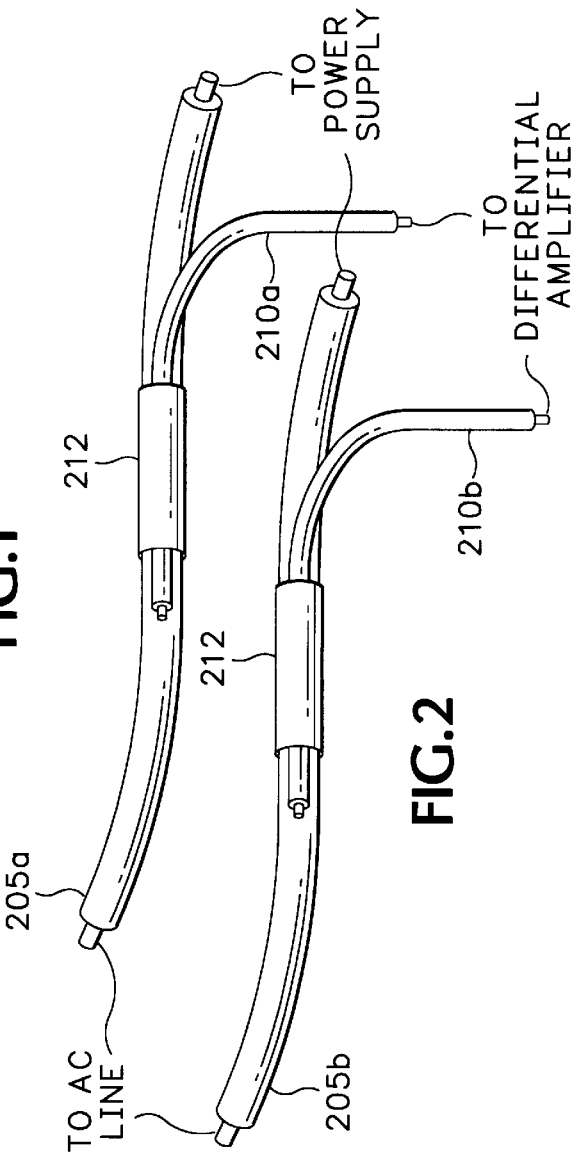
FIG. 2 shows an embodiment of the invention in pictorial form.

Referring to the simplified pictorial drawing of FIG. 2, a pair of wires 205a, 205b, conveys AC line voltage from the AC line to a power supply (not shown in FIG. 2). A first pick-off, or sense, wire 210a is placed adjacent to AC line wire 205a, and a second pick-off, or sense, wire 210b is placed adjacent to AC line wire 205b. The sense wires are secured to the AC line wires in a non-conductive manner. Preferably they are tightly coupled by threading a pair of wires comprising an AC line wire and a sense wire through a sleeve of heat shrinkable tubing 212, and applying heat. The free ends of pick-off wires 210a and 210b are coupled to the input of a differential amplifier (not shown in FIG. 2), for conveying the capacitively coupled representation of the AC line voltage for amplification.

Figure 3:
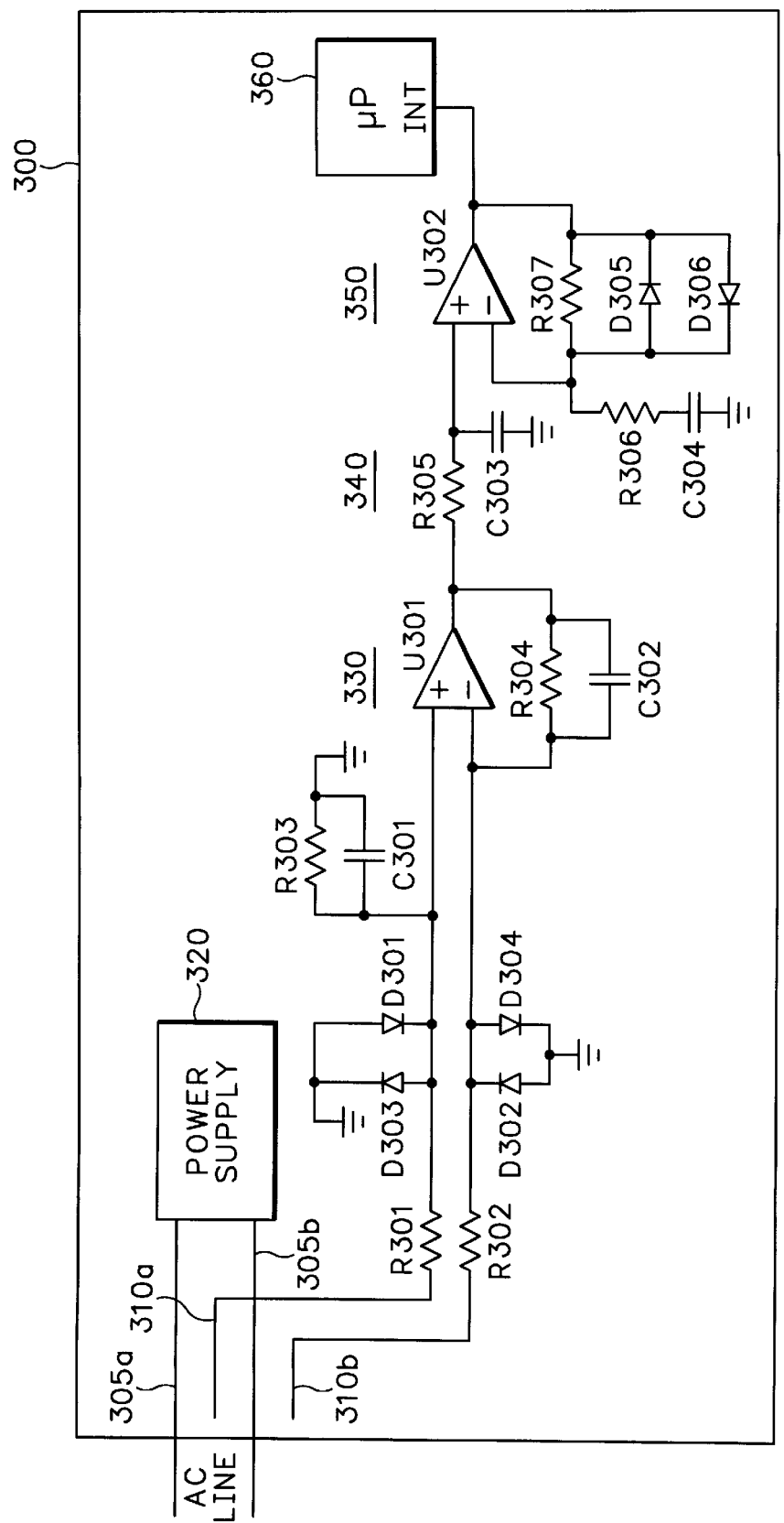
FIG. 3 shows an embodiment of the invention, partly in schematic form and partly in block diagram form.

Referring to FIG. 3, an instrument 300, which may be an oscilloscope, receives power from the AC line via a pair of wires 305a, 305b, which are coupled to an internal power supply 320. Internal power supply 320 provides operating power to the circuitry of instrument 300. Each of a pair of sense lines comprising wires 310a and 310b is non-conductively fastened, but capacitively-coupled to a respective one of AC power line wires 305a and 305b. Wires 310a and 310b capacitively couple a signal representative of the AC line voltage to a processing channel comprising an amplifier 330, a lowpass filter 340, a further amplifier 350, and ultimately to a control microprocessor ($\mu$P) 360.

Sense wires 310a and 310b are coupled to the processing channel via protection resistors R301 and R302. Each sense line is further protected by a pair of input clamping diodes D301, D303, and D302, D304, which clamp the input voltage to approximately 0.7 volts. Amplifier 330 comprises integrated circuit (IC) amplifier U301, which may be an MC34002 IC amplifier, manufactured by Motorola, Inc. is configured as a differential amplifier which amplifies the input AC signals equally and provides an output signal at a single-ended output. Amplifier 330 also comprises RC (resistor-capacitor) bias networks R303, C301, and R304, C302 for setting the gain of the stage. Amplifier 330 is preferably biased to set a detection threshold for the input AC signal of substantially zero volts. By setting detection threshold at zero volts (i.e. the mid-point of the AC signal) the detection point is insensitive to variations in the AC power line signal amplitude.

The amplified AC signal is applied to a lowpass filter 340. Lowpass filter 340 may be an RC filter comprising resistor R305, and capacitor C303, and is provided to reduce unwanted high frequency components from the amplified AC signal. Both capacitor C302 and capacitor C303 affect the high frequency roll-off of the AC signal being processed. The lowpass-filtered AC signal is applied to the input of Amplifier 350. Amplifier 350 is a high gain amplifier for providing the majority of the amplification in the AC signal processing channel. Amplifier 350 comprises integrated circuit (IC) amplifier U302, which may be an MC34002 IC amplifier, manufactured by Motorola, Inc. Amplifier 350 includes resistive gain setting elements R306, R307, and capacitor 304, and an amplitude limiting circuit comprising diodes D305, and D306 arranged in an antiparallel configuration, to accommodate the wide range of input AC line voltages which may be present, which may be approximately 90 VAC to approximately 250 VAC. The gain of amplifier 350 is desirably a gain of 25×.

The AC signal is coupled to a utilization circuit (which may be a microprocessor 360). The AC signal may be applied to an interrupt input INT of microprocessor 360 to exercise an interrupt to generate an AC trigger (e.g., for an oscilloscope) upon each detection of an AC line voltage signal. The output signal may be used to synchronize the sweep circuitry (not shown) of the oscilloscope with the AC line voltage.

It is noted in passing that synchronization to the AC line current is not suitable because the AC line current is usually not well synchronized with the AC line voltage, especially with the wide-spread use of switching power supplies in many products.

TABLE 1

| | |
|---|---|
| R301 | 100 kΩ |
| R302 | 100 kΩ |
| R303 | 100 kΩ |
| R304 | 100 kΩ |
| R305 | 100 kΩ |
| R306 | 4 kΩ |
| R307 | 100 kΩ |
| C301 | 0.01 µf |
| C302 | 0.01 µf |
| C303 | 0.01 µf |
| C304 | 2.2 µf |

Thus, there has been described a circuit for picking-off an AC line voltage representative signal which overcomes the disadvantages of the prior art transformer and optical isolator arrangements by providing high isolation from the AC line, by coupling only a safe low voltage signal to the internal processing circuits, and by eliminating the cost, testing, and certification of the prior art isolation devices.

While the utilization circuit was described with reference to a microprocessor, the invention is not intended to so limited. That is, the output signal of the subject invention may be applied to a sweep circuit generator, or to any circuit which utilizes such a line-derived signal, such as an AC line-frequency clock circuit.

The term "microprocessor", as used herein, is intended to include microprocessors, microcomputers, ASICs, and dedicated discrete hardware devices serving the function of a controller utilizing the above-described AC line derived signal.

Although the sense wire was described as being tightly coupled to the AC power line wire by means of heat shrinkable tubing, it is herein recognized that may other means for firmly affixing the sense wire adjacent to the AC line wire may be used. For example the two wires may be glued together, or they may be laced (i.e., tied) together along a given length using lacing cord.

While the invention has been described with respect to an oscilloscope, it is herein recognized that it is also applicable to other types of test and measurement equipment, and such modification is deemed to lie within the scope of the following claims.

What is claimed is:

1. A circuit for deriving a signal representative of an AC power line voltage signal, comprising:

first and second AC power line wires for conveying said AC line voltage signal;

first and second sense wires non-conductively mounted adjacent to said first and second AC power line wires respectively for receiving said signal representative of said AC line voltage signal, said first and second sense wires receiving said representative signal from said AC power line wires via capacitive coupling; and a signal processing channel coupled to said sense wires for receiving said representative signal and producing an amplified and filtered representative signal of said representative signal at an output;

said processing channel including a differential amplifier having a pair of input terminals coupled to respective ones of said first and second sense wires, and having a single-ended output;

a lowpass filter, having an input coupled to said output of said differential amplifier, for reducing undesired high frequency components of said representative signal; and a further amplifier circuit for producing an amplified representative signal, said further amplifier including an amplitude limiting circuit for limiting amplitude excursions of said amplified representative signal.

2. A circuit for use in an oscilloscope for deriving a signal representative of an AC power line voltage signal, comprising:

first and second AC power line wires for conveying said AC line voltage signal;

first and second sense wires non-conductively mounted adjacent to said first and second AC power line wires respectively for receiving said signal representative of said AC line voltage signal, said first and second sense wires receiving said representative signal from said AC power line wires via capacitive coupling; and a signal processing channel coupled to said sense wires for receiving said representative signal and producing an amplified and filtered representative signal of said representative signal at an output;

said processing channel including a differential amplifier having a pair of input terminals coupled to respective ones of said first and second sense wires, and having a single-ended output;

a lowpass filter, having an input coupled to said output of said differential amplifier, for reducing undesired high frequency components of said representative signal; and a further amplifier circuit for producing an amplified representative signal, said further amplifier including an amplitude limiting circuit for limiting amplitude excursions of said amplified representative signal.

3. The circuit of claim 2, further including:

a utilization circuit coupled to said output of said further amplifier for receiving said amplified representative signal for performing a function to be synchronized with said AC line voltage signal.

4. The circuit of claim 3, wherein said utilization circuit synchronizes a sweep function of said oscilloscope to said AC line voltage signal, and said amplified representative signal is an AC line trigger signal.

5. The circuit of claim 4, wherein said differential amplifier is biased to exhibit a detection threshold for said input signal of substantially zero volts.

* * * * *